(12) United States Patent
Choo et al.

(10) Patent No.: US 10,998,318 B2
(45) Date of Patent: May 4, 2021

(54) SEMICONDUCTOR MEMORY DEVICE

(71) Applicant: SAMSUNG ELECTRONICS CO., LTD., Suwon-si (KR)

(72) Inventors: Seongmin Choo, Seoul (KR); Hyukwoo Kwon, Seoul (KR); Jangseop Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/257,260

(22) Filed: Jan. 25, 2019

(65) Prior Publication Data

US 2020/0006345 A1     Jan. 2, 2020

(30) Foreign Application Priority Data

Jul. 2, 2018   (KR) .......................... 10-2018-0076426

(51) Int. Cl.
*H01L 27/108*     (2006.01)

(52) U.S. Cl.
CPC .... *H01L 27/10805* (2013.01); *H01L 27/1085* (2013.01)

(58) Field of Classification Search
CPC .......................... H01L 27/10805; H01L 28/90
See application file for complete search history.

(56) References Cited

U.S. PATENT DOCUMENTS

| | | | |
|---|---|---|---|
| 6,784,479 B2* | 8/2004 | Park | H01L 28/91 257/308 |
| 7,700,469 B2 | 4/2010 | Benson | |
| 8,927,384 B2* | 1/2015 | Kim | H01L 27/10817 438/381 |
| 9,070,701 B2 | 6/2015 | Lim et al. | |
| 10,249,706 B1* | 4/2019 | Chang | H01L 27/10897 |
| 2004/0065938 A1 | 4/2004 | Won et al. | |
| 2005/0118803 A1* | 6/2005 | Hichri | H01L 23/585 438/672 |
| 2008/0186648 A1* | 8/2008 | Choi | H01G 4/005 361/305 |
| 2009/0165572 A1* | 7/2009 | Harish | G01L 1/142 73/862.626 |

(Continued)

FOREIGN PATENT DOCUMENTS

| | | |
|---|---|---|
| JP | 5-275649 A | 10/1993 |
| KR | 10-2008-0060329 A | 7/2008 |
| KR | 10-2009-0099775 A | 9/2009 |

*Primary Examiner* — Laura M Menz
*Assistant Examiner* — Khatib A Rahman
(74) *Attorney, Agent, or Firm* — Lee IP Law, P.C.

(57) ABSTRACT

A semiconductor memory device includes lower electrodes, each of the lower electrodes surrounding an inner space, an upper support layer on top surfaces of the lower electrodes, the upper support layer being on the inner spaces surrounded by the lower electrodes, and an upper electrode on the upper support layer, the upper electrode filling first and second regions, the second region penetrating the upper support layer, and the first region extending from the second region into between the lower electrodes. Each of the lower electrodes includes a first portion overlapping with the first region, a top surface of the first portion being exposed by the upper support layer, and a second portion covered by the upper support layer, a top surface of the second portion being in contact with the upper support layer.

20 Claims, 15 Drawing Sheets

(56) References Cited

U.S. PATENT DOCUMENTS

| | | | |
|---|---|---|---|
| 2012/0248520 A1 | 10/2012 | Uchiyama | |
| 2014/0138794 A1* | 5/2014 | Yang | H01L 28/87 |
| | | | 257/532 |
| 2016/0365409 A1* | 12/2016 | Lee | H01L 28/90 |
| 2016/0379985 A1* | 12/2016 | Choi | H01L 21/31116 |
| | | | 438/396 |
| 2017/0025416 A1* | 1/2017 | Han | H01L 27/10855 |
| 2017/0103987 A1* | 4/2017 | Kim | H01L 27/10885 |
| 2017/0194261 A1* | 7/2017 | Yoon | H01L 23/535 |
| 2018/0166320 A1 | 6/2018 | Kim | |
| 2018/0166449 A1* | 6/2018 | Pak | G11C 7/12 |

\* cited by examiner

SEMICONDUCTOR MEMORY DEVICE

CROSS-REFERENCE TO RELATED APPLICATION

Korean Patent Application No. 10-2018-0076426, filed on Jul. 2, 2018, in the Korean Intellectual Property Office, and entitled: "Semiconductor Memory Device," is incorporated by reference herein in its entirety.

BACKGROUND

1. Field

Embodiments relate to a semiconductor memory device and, more particularly, to a semiconductor memory device with improved electrical characteristics.

2. Description of the Related Art

Light, small, high-speed, multi-functional, high-performance, high-reliability, and low-price electronic components have been increasingly demanded in the electronic industry (e.g., portable phones and note books). To satisfy these demands, it may be required to increase the integration density of semiconductor memory devices. In addition, it may be required to improve performance of semiconductor memory devices.

A capacitance of a capacitor may be increased to improve reliability of a highly integrated semiconductor memory device including the capacitor. For example, the capacitance of the capacitor may increase as an aspect ratio of a lower electrode of the capacitor increases. Thus, various researches are conducted for a process technique of forming a capacitor having a high aspect ratio.

SUMMARY

In an aspect, a semiconductor memory device may include lower electrodes, an upper support layer disposed on top surfaces of the lower electrodes, and an upper electrode that is disposed on the upper support layer and fills a first region penetrating the upper support layer and a second region extending from the first region into between the lower electrodes. Each of the lower electrodes may include a first portion overlapping with the first region, and a second portion covered by the upper support layer. A top surface of the first portion may be exposed by the upper support layer, and a top surface of the second portion may be in contact with the upper support layer. The upper support layer may be disposed in an inner space surrounded by each of the lower electrodes.

In an aspect, a semiconductor memory device may include lower electrodes, an upper support layer disposed on top surfaces of the lower electrodes, and an upper electrode that is disposed on the upper support layer and fills a first region penetrating the upper support layer and a second region extending from the first region into between the lower electrodes. Each of the lower electrodes may include a first portion overlapping with the first region, and a second portion covered by the upper support layer. The first portion may not vertically overlap with the upper support layer, and the second portion may vertically overlap with the upper support layer. The upper support layer may be disposed in an inner space surrounded by each of the lower electrodes.

In an aspect, a semiconductor memory device may include lower electrodes, an upper support layer disposed on top surfaces of the lower electrodes, and an upper electrode that is disposed on the upper support layer and fills a first region penetrating the upper support layer and a second region extending from the first region into between the lower electrodes. Each of the lower electrodes may include a first portion overlapping with the first region, and a second portion covered by the upper support layer. An outer sidewall of the first portion may be spaced apart from the upper support layer, and an outer sidewall of the second portion may be in contact with the upper support layer. The upper support layer may be disposed in an inner space surrounded by each of the lower electrodes.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
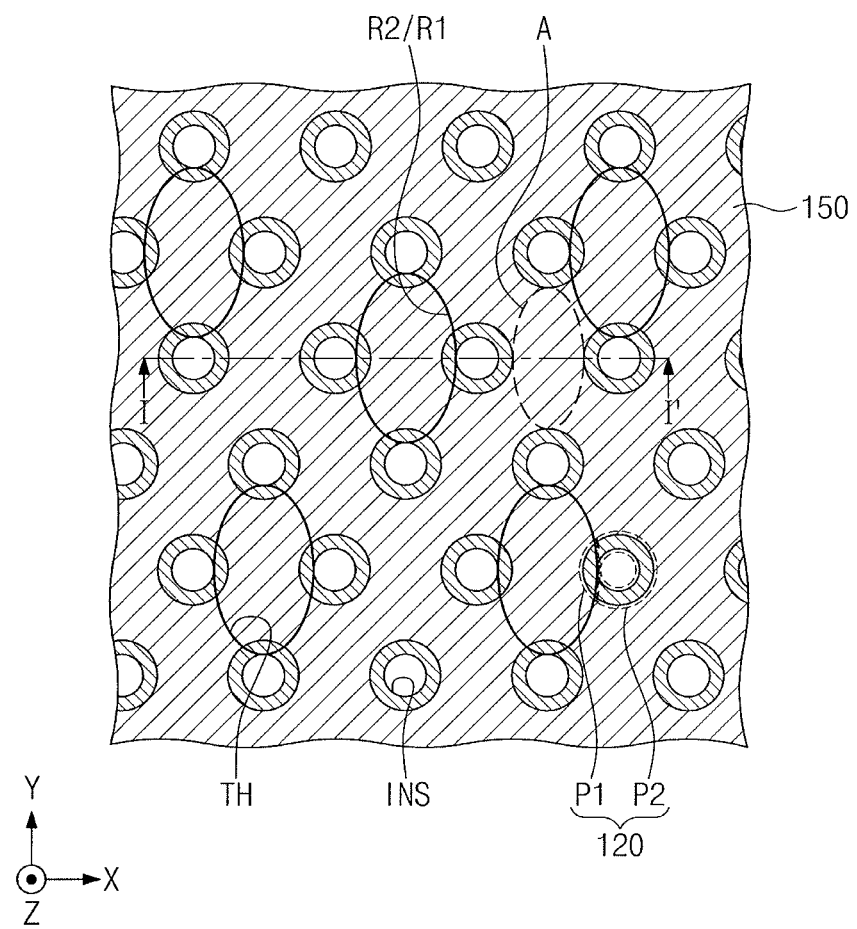
FIG. 1 illustrates a plan view of a semiconductor memory device according to some embodiments.
Figure 2:
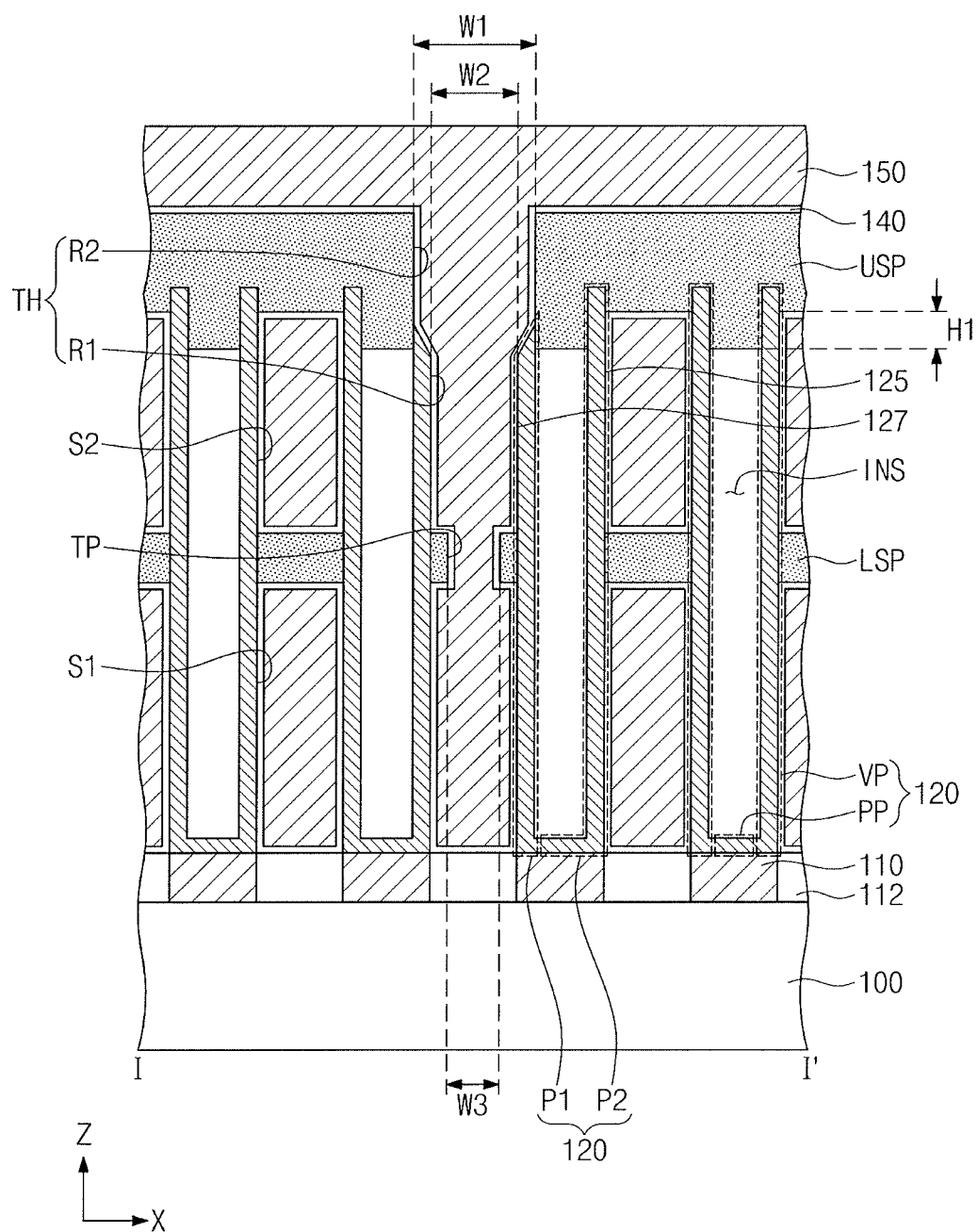
FIG. 2 illustrates a cross-sectional view along line I-I' of FIG. 1.

FIG. 1 is a plan view illustrating a semiconductor memory device according to some embodiments, e.g., a dynamic random-access memory (DRAM). FIG. 2 is a cross-sectional view taken along line I-I' of FIG. 1 to illustrate a semiconductor memory device according to some embodiments.

Referring to FIGS. 1 and 2, contact plugs 110 may be disposed on a substrate 100. The substrate 100 may be a semiconductor substrate, e.g., a silicon substrate, a germanium substrate, or a silicon-germanium (SiGe) substrate. For example, the contact plugs 110 may be arranged in a zigzag form in a first direction X or in a second direction Y intersecting the first direction X when viewed in a plan view. For example, referring to FIG. 1, if the contact plugs 110 are below lower electrodes 120 (as illustrated in FIG. 2), the contact plugs 110 may be arranged in the zigzag pattern of lower electrodes 120. For example, the contact plugs 110 may include at least one of a doped semiconductor material (e.g., doped poly-crystalline silicon), a metal-semiconductor compound (e.g., tungsten silicide), a conductive metal nitride (e.g., titanium nitride, tantalum nitride, or tungsten nitride), or a metal (e.g., titanium, tungsten, or tantalum).

As illustrated in FIG. 2, an interlayer insulating layer 112 may be disposed on the substrate 100. The interlayer insulating layer 112 may fill a space between the contact plugs 110. For example, the interlayer insulating layer 112 may include at least one of a silicon oxide layer, a silicon nitride layer, or a silicon oxynitride layer. Even though not shown in the drawings, word lines and bit lines intersecting the word lines may be formed on the substrate 100 and/or in the substrate 100. The interlayer insulating layer 112 may be formed to cover the word lines and the bit lines. Dopant regions may be formed in the substrate 100 at both sides of each of the word lines, and each of the contact plugs 110 may be connected to one of the dopant regions.

The lower electrodes 120 may be disposed on the contact plugs 110. Each of the lower electrodes 120 may include a vertical portion VP and a horizontal portion PP connected to a bottom end of the vertical portion VP. The vertical portion VP may extend upward from an edge of the horizontal portion PP, e.g., along a third direction Z. The horizontal portion PP may be connected to each of the contact plugs 110. Each of the lower electrodes 120 may have a U-shape when viewed in a cross-sectional view (FIG. 2). Each of the lower electrodes 120 may have a ring shape when viewed in a plan view (FIG. 1). For example, the lower electrodes 120 may include at least one of a metal material (e.g., cobalt, titanium, nickel, tungsten, or molybdenum), a metal nitride (e.g., titanium nitride (TiN), titanium-silicon nitride (TiSiN), titanium-aluminum nitride (TiAlN), tantalum nitride (TaN), tantalum-aluminum nitride (TaAlN), or tungsten nitride (WN)), a noble metal (e.g., platinum (Pt), ruthenium (Ru), or iridium (Ir), a conductive oxide (e.g., PtO, $RuO_2$, $IrO_2$, $SrRuO_3$ (SRO), $(Ba,Sr)RuO_3$ (BSRO), $CaRuO_3$ (CRO), or LSCo), or a metal silicide.

As illustrated in FIG. 1, a first region R1 may be defined as a region between four lower electrodes 120 adjacent to each other, e.g., the four adjacent lower electrodes 120 may be arranged along a perimeter of the first region R1 (solid line ellipses in FIG. 1 represents an approximate location of region R1). For example, the first region R1 may be defined between a pair of the lower electrodes 120 adjacent to each other in the first direction X, and between a pair of the lower electrodes 120 adjacent to each other in the second direction Y. The first region R1 may be provided in plurality, and the plurality of first regions R1 may be arranged in a zigzag form in the first direction X. In some embodiments, the first region R1 may be a region in which an upper electrode 150 is provided.

As illustrated in FIG. 2, an upper support layer USP may be disposed on top surfaces of the lower electrodes 120. The upper support layer USP may include a second region R2 overlapping with the first region R1, e.g., along the third direction Z (FIG. 2). The upper electrode 150 disposed on the upper support layer USP may pass through the second region R2. The first region R1 and the second region R2 may be connected to each other, e.g., in fluid communication with each other. In some embodiments, the first region R1 and the second region R2 may be defined as a through-hole TH. For example, the through-hole TH may include the first region R1 extending from the second region R2 into between the lower electrodes 120. For example, as illustrated in FIG. 2, the first region R1 may extend, e.g., continuously, from the interlayer insulating layer 112 upward in the third direction Z, and the second region R2 may extend, e.g., continuously, from the first region R1 upward to a top of the upper support layer USP. For example, the second region R2 may be wider than the first region R1 in the first direction X, so when the first and second regions R1 and R2 overlap each other in a top view, only the second region R2 may be seen (as seen by the solid line ellipses in FIG. 1).

Each of the lower electrodes 120 may include a first portion P1 vertically overlapping with the through-hole TH, and a second portion P2 corresponding to a remaining portion of the lower electrode 120 except the first portion P1. For example, as illustrated in FIG. 2, the first portion P1 may extend along a sidewall of the through-hole TH in the third direction Z, and the second portion P2 may extend horizontally, e.g., radially, from a bottom of the first portion P1 and may be bent to extend upward in the third direction Z, e.g., in parallel to the first portion P1. For example, as further illustrated in FIG. 2, the first portion P1 may be shorter than a vertical portion of the second portion P2 relatively to the contact plugs 110, e.g., as a top surface of the first portion P1 abuts a bottom edge of the second region R2. For example, referring to FIGS. 1-2, if the lower electrode 120 has a shape of a hollow cylinder, a vertical portion of such hollow cylinder contacting the through-hole TH may be the first portion P1, while the remainder of the hollow cylinder may be the second portion P2.

For example, the first portion P1 of the lower electrode 120 may vertically overlap with the second region R2, e.g., the top surface of the first portion P1 of the lower electrode 120 may overlap the bottom edge of the second region R2 along the third direction Z. For example, the second portion P2 may be covered, e.g., overlapped along the third direction Z, by the upper support layer USP. For example, the second portion P2 may not vertically overlap with the second region R2, e.g., the second portion P2 may be spaced apart from the second region R2 along both the first and third direction X and Z. A topmost surface of the first portion P1 may be disposed at a lower level than a topmost surface of the second portion P2. In other words, the topmost surface of the first portion P1 may be closer to the substrate 100 than the topmost surface of the second portion P2. The top surface of the first portion P1 may be inclined with respect to a top surface of the substrate 100, and the top surface of the second portion P2 may be parallel to the top surface of the substrate 100. A first width W1 of the through-hole TH disposed on the top surfaces of the first portions P1 (i.e., the first width W1 of the second region R2 in the first direction X) may be greater than a second width W2 of the through-hole TH disposed below the top surfaces of the first portions P1 (i.e., the second width W2 of the first region R1 in the first direction X). That is, W1>W2.

The upper support layer USP may not vertically overlap with the first portions P1 of the lower electrodes 120 but may vertically overlap with the second portions P2 of the lower electrodes 120. The upper support layer USP may expose the top surfaces of the first portions P1 of the lower electrodes 120, and may be in contact with the top surfaces of the second portions P2 of the lower electrodes 120. The upper support layer USP may surround upper portions of outer sidewalls 125 of the second portions P2. The upper support layer USP may be disposed in a space between the second portions P2 of the lower electrodes 120. The upper support layer USP may be spaced apart from outer sidewalls 127 of the first portions P1, and may be in contact with the upper portions of the outer sidewalls 125 of the second portions P2.

The upper support layer USP may be disposed, e.g., partially, in an inner space INS surrounded by each of the lower electrodes 120. The upper support layer USP may fill, e.g., only, upper portions of the inner spaces INS. The upper support layer USP may be in contact with inner sidewalls of the lower electrodes 120 and may be spaced apart from bottom surfaces of the lower electrodes 120. The bottom surfaces of the lower electrodes 120 may correspond to bottom surfaces of the inner spaces INS. The inner spaces INS between a bottom surface of the upper support layer USP disposed in the inner spaces INS and the bottom surfaces of the lower electrodes 120 may be filled with air.

A contact area between the upper support layer USP and the inner sidewall of the second portion P2 of the lower electrode 120 may be greater than a contact area between the upper support layer USP and the outer sidewall 125 of the second portion P2 of the lower electrode 120. For example, as illustrated in FIG. 2, the upper support layer USP may overlap the inner sidewall of the second portion P2 to a greater depth along the third direction Z than it overlaps the outer sidewall 125 of the second portion P2, e.g., greater by depth H1 along the third direction Z. A level (or height) of the bottom surface of the upper support layer USP disposed in the inner space INS may be different from a level (or height) of a bottom surface of the upper support layer USP disposed on the outer sidewall 125 of the second portion P2. For example, the bottom surface of the upper support layer USP disposed in the inner space INS may be closer to the substrate 100 than the bottom surface of the upper support layer USP disposed on the outer sidewall 125 of the second portion P2. The upper support layer USP may include a material having a gap-fill characteristic capable of filling the upper portion of the inner space INS. For example, the upper support layer USP may include at least one of SiOC, SiBN, SiCN, doped SiN, or Si.

According to the embodiments, the upper support layer USP may be disposed on the top surfaces of the lower electrodes 120 to increase usable areas of the lower electrodes 120, and the upper support layer USP may be disposed in the inner spaces INS of the lower electrodes 120 to increase the contact areas between the upper support layer USP and the lower electrodes 120. Thus, a capacitance of a capacitor may be increased and supporting force of the upper support layer USP may also be increased.

According to the embodiments, the upper support layer USP may be disposed on the top surfaces of the lower electrodes 120, and thus contact areas between the upper support layer USP and the lower electrodes 120 may be reduced. As a result, stress applied to a portion 'A' (see FIG. 1) of the upper support layer USP disposed between the second portions P2 of the lower electrodes 120 may be reduced. Thus, it is possible to minimize a difference between a first distance between the lower electrodes 120, between which the upper support layer USP is not provided (i.e., a distance between the first portions P1 of the lower electrodes 120), and a second distance between the lower electrodes 120, between which the upper support layer USP is provided (i.e., a distance between the second portions P2 of the lower electrodes 120).

As further illustrated in FIG. 2, a lower support layer LSP may be disposed on outer sidewalls of the lower electrodes 120. The lower support layer LSP may be disposed between the upper support layer USP and the substrate 100. The lower support layer LSP may be spaced apart from the upper support layer USP, e.g., along the third direction Z. The lower support layer LSP may be in contact with and surround portions of the outer sidewalls of the lower electrodes 120. The lower support layer LSP may have a through-portion TP, e.g., in the through-hole TH. The through-portion TP may vertically overlap with the through-hole TH. The through-portion TP and the through-hole TH may be connected to each other to constitute one hole. For example, a width W3 of the through-portion TP may be less than the second width W2 of the through-hole TH.

The upper electrode 150 may be disposed on the upper support layer USP. The upper electrode 150 may pass through the second region R2 of the upper support layer USP and may fill the through-portion TP of the lower support layer LSP and the first region R1 between the lower electrodes 120. The upper electrode 150 may fill a first space S1 between the substrate 100 and the lower support layer LSP and a second space S2 between the lower support layer LSP and the upper support layer USP. The upper electrode 150 may cover the outer sidewalls of the lower electrodes 120, which are exposed by the lower support layer LSP and the upper support layer USP. The upper electrode 150 may be formed of at least one of, e.g., a semiconductor material doped with dopants, a metal material, a metal nitride, or a metal silicide. In some embodiments, the upper electrode 150 may be formed of a refractory metal material, e.g., cobalt, titanium, nickel, tungsten, and/or molybdenum. In certain embodiments, the upper electrode 150 may be formed of a metal nitride, e.g., titanium nitride (TiN), titanium-aluminum nitride (TiAlN), and/or tungsten nitride (WN). In certain embodiments, the upper electrode 150 may be formed of at least one of, e.g., platinum (Pt), ruthenium (Ru), or iridium (Ir).

A dielectric layer 140 may be disposed between the upper electrode 150 and the interlayer insulating layer 112, between the upper electrode 150 and the outer sidewalls 127 of the first portions P1 of the lower electrodes 120, between the upper electrode 150 and the outer sidewalls 125 of the second portions P2 of the lower electrodes 120, between the upper electrode 150 and the lower support layer LSP, and between the upper electrode 150 and the upper support layer USP. The dielectric layer 140 may be in contact with the top surfaces of the first portions P1 of the lower electrodes 120 and may be spaced apart from the top surfaces of the second portions P2 of the lower electrodes 120. The dielectric layer 140 may be in contact with the outer sidewalls 127 of the first portions P1 of the lower electrodes 120 and the outer sidewalls 125 of the second portions P2 of the lower electrodes 120. For example, the dielectric layer 140 may be formed of at least one of a metal oxide (e.g., $HfO_2$, $ZrO_2$, $Al_2O_3$, $La_2O_3$, $Ta_2O_3$, or $TiO_2$) or a perovskite dielectric material (e.g., $SrTiO_3$ (STO), $(Ba,Sr)TiO_3$ (BST), $BaTiO_3$, PZT, or PLZT). The dielectric layer 140 may have a single-layered structure or a multi-layered structure.

Figure 3:
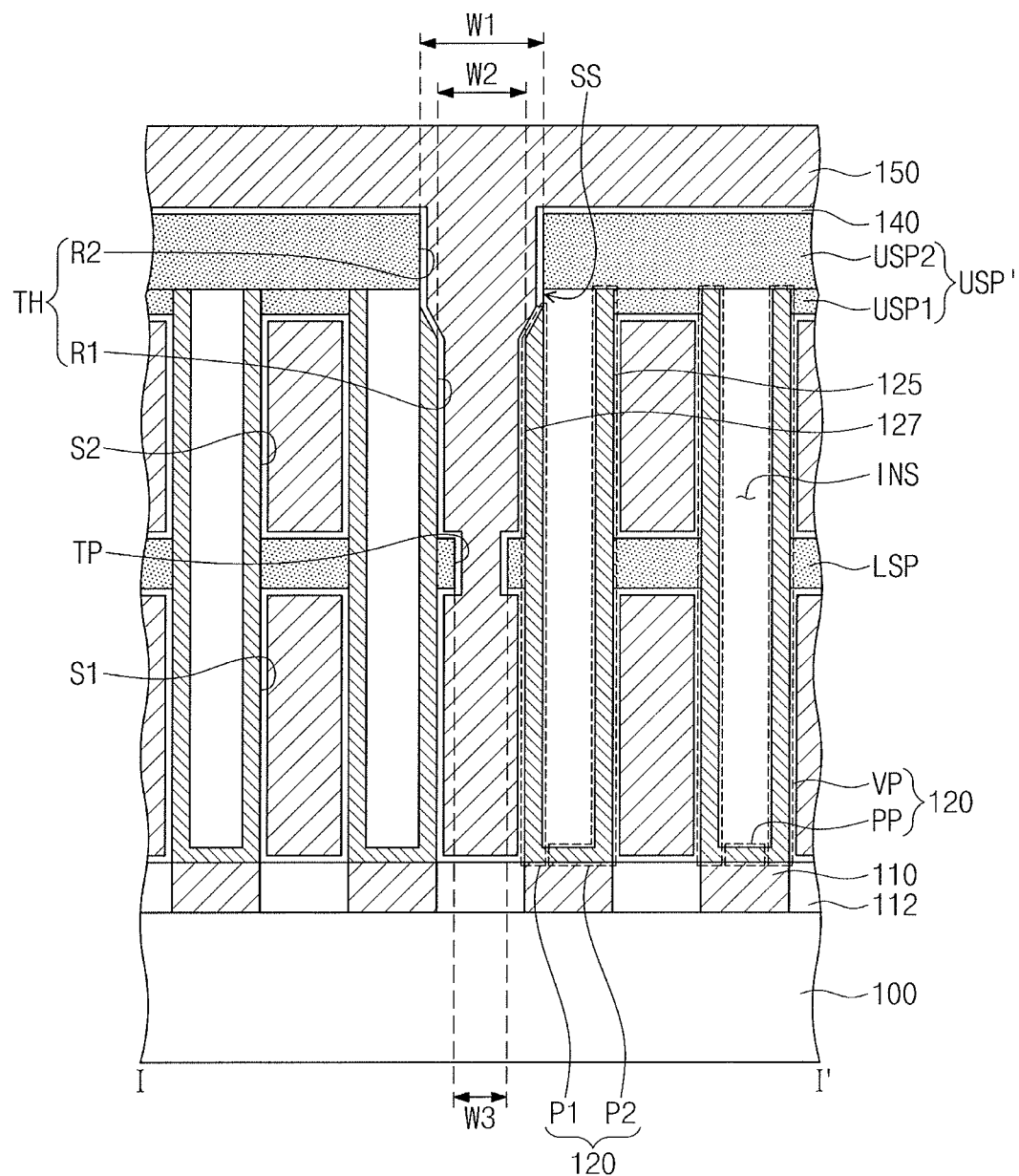
FIG. 3 illustrates a cross-sectional view corresponding to line I-I' of FIG. 1 of a semiconductor memory device according to some embodiments.

FIG. 3 is a cross-sectional view taken along the line I-I' of FIG. 1 to illustrate a semiconductor memory device according to some embodiments. In the present embodiment, descriptions of the same technical features as in the embodiments of FIGS. 1 and 2 will be omitted or mentioned only briefly for the purpose of ease and convenience in explanation.

Referring to FIG. 3, an upper support layer USP' may be disposed on the top surfaces of the second portions P2 of the lower electrodes 120. The upper support layer USP' may include a first upper support layer USP1 and a second upper support layer USP2. The first upper support layer USP1 may be disposed on the outer sidewalls 125 of the second portions P2 of the lower electrodes 120. The first upper support layer USP1 may be in contact with and surround upper portions of the outer sidewalls 125 of the second portions P2 of the lower electrodes 120. The first upper support layer USP1 may be spaced apart from the lower support layer LSP. For example, the first upper support layer USP1 may include at least one of SiOC, SiBN, SiCN, doped SiN, or Si.

The second upper support layer USP2 may be disposed on the first upper support layer USP1. The second upper support layer USP2 may not vertically overlap with the first portions P1 of the lower electrodes 120 but may vertically overlap with the second portions P2 of the lower electrodes 120. The second upper support layer USP2 may be in contact with the top surfaces of the second portions P2 and may expose the top surfaces of the first portions P1. For example, separation spaces SS may be provided between the second upper support layer USP2 and the top surfaces of the first portions P1. The second upper support layer USP2 may not be disposed in the inner spaces INS. For example, the second upper support layer USP2 may be spaced apart from the inner sidewalls and the bottom surfaces of the lower electrodes 120.

The first upper support layer USP1 and the second upper support layer USP2 may be in contact with each other. For example, the second upper support layer USP2 may include the same material as the first upper support layer USP1. In another example, the second upper support layer USP2 may include a different material from that of the first upper support layer USP1. For example, the second upper support layer USP2 may include at least one of SiOC, SiBN, SiCN, doped SiN, or Si.

The dielectric layer 140 may be disposed between the upper electrode 150 and the interlayer insulating layer 112, between the upper electrode 150 and the outer sidewalls 127 of the first portions P1 of the lower electrodes 120, between the upper electrode 150 and the outer sidewalls 125 of the second portions P2 of the lower electrodes 120, between the upper electrode 150 and the lower support layer LSP, and between the upper electrode 150 and the upper support layer USP. The dielectric layer 140 may fill the separation spaces SS. The dielectric layer 140 may not be disposed in the inner spaces INS. The dielectric layer 140 may be in contact with the top surfaces of the first portions P1 of the lower electrodes 120 and may be spaced apart from the inner sidewalls of the lower electrodes 120.

FIGS. 4 to 9 are cross-sectional views taken along the line I-I' of FIG. 1 to illustrate a method of manufacturing a semiconductor memory device according to some embodiments.

Figure 4:
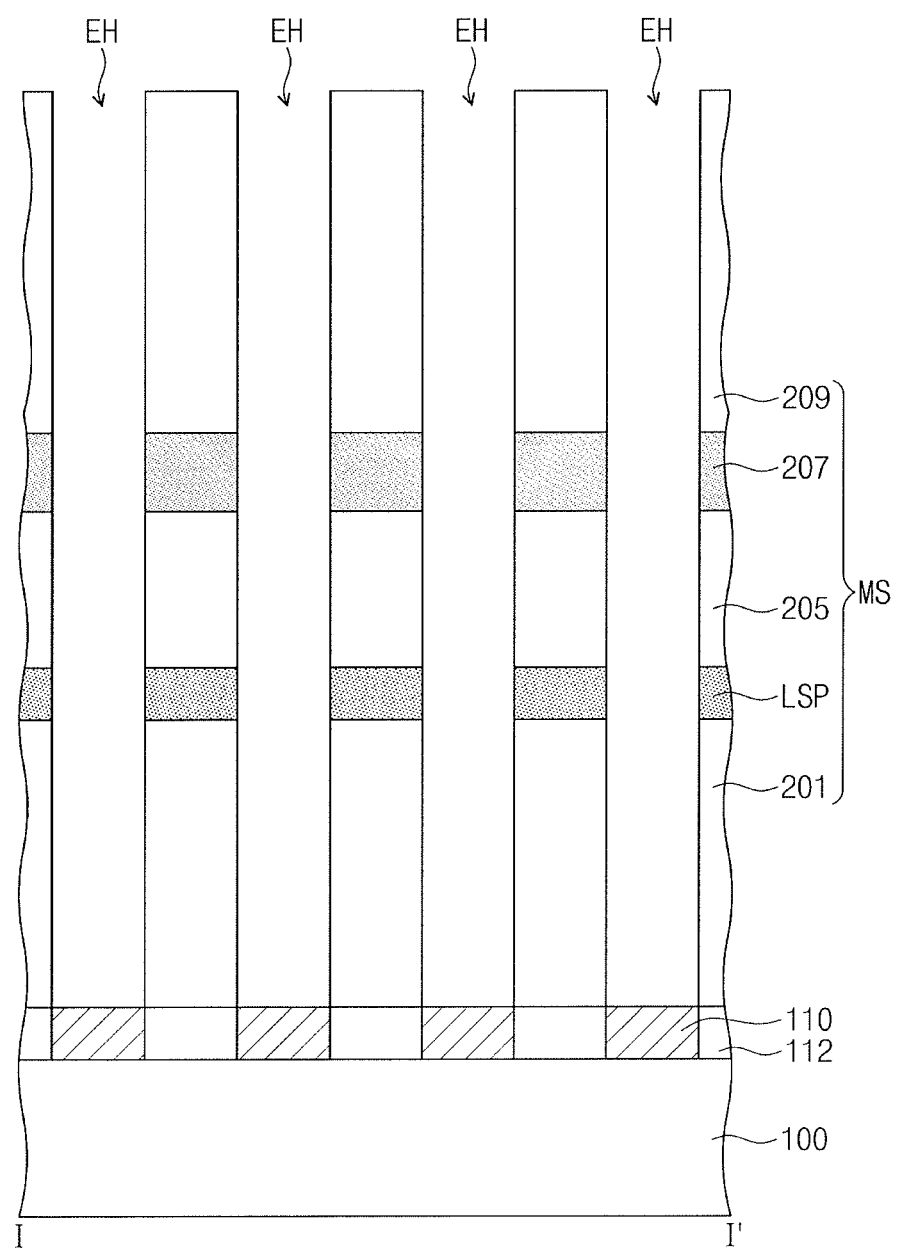
FIGS. 4 to 9 illustrate cross-sectional views corresponding to line I-I' of FIG. 1 of stages in a method of manufacturing a semiconductor memory device according to some embodiments.

Referring to FIG. 4, the interlayer insulating layer 112 may be formed on the substrate 100. The substrate 100 may be a semiconductor substrate, e.g., a silicon substrate, a germanium substrate, or a silicon-germanium (SiGe) substrate. For example, the interlayer insulating layer 112 may include at least one of a silicon oxide layer, a silicon nitride layer, or a silicon oxynitride layer.

Contact plugs 110 may be formed in the interlayer insulating layer 112. For example, the contact plugs 110 may include at least one of a doped semiconductor material (e.g., doped poly-crystalline silicon), a metal-semiconductor compound (e.g., tungsten silicide), a conductive metal nitride (e.g., titanium nitride, tantalum nitride, or tungsten nitride), or a metal (e.g., titanium, tungsten, or tantalum). Even though not shown in the drawings, word lines and bit lines intersecting the word lines may be formed on the substrate 100 and/or in the substrate 100. The interlayer insulating layer 112 may be formed to cover the word lines and the bit lines. Dopant regions (not shown) may be formed in the substrate 100 at both sides of each of the word lines, and each of the contact plugs 110 may be connected to one of the dopant regions.

A mold structure MS may be formed on the interlayer insulating layer 112. The mold structure MS may include a first mold layer 201, the lower support layer LSP, a second mold layer 205, a third mold layer 207, and a first mask layer 209, which are sequentially stacked on the interlayer insulating layer 112. The mold structure MS may have electrode holes EH. Top surfaces of the contact plugs 110 may be exposed through the electrode holes EH. In some embodiments, the first mask layer 209, the third mold layer 207, the second mold layer 205, the lower support layer LSP, and the first mold layer 201 may be anisotropically etched using a mask pattern formed on the first mask layer 209 as an etch mask to form the electrode holes EH. The anisotropic etching process may use an etching gas for etching the first mask layer 209, an etching gas for etching the first and second mold layers 201 and 205, and an etching gas for etching the lower support layer LSP and the third mold layer 207.

Each of the first and second mold layers 201 and 205 may include, e.g., a silicon oxide layer or an oxide layer including germanium (Ge). The lower support layer LSP may be formed of a material having an etch selectivity with respect to the first and second mold layers 201 and 205. For example, the lower support layer LSP may include a silicon carbonitride (SiCN) layer. The third mold layer 207 may include, e.g., a silicon nitride (SiN) layer. The first mask layer 209 may include, e.g., a poly-silicon layer.

Figure 5:
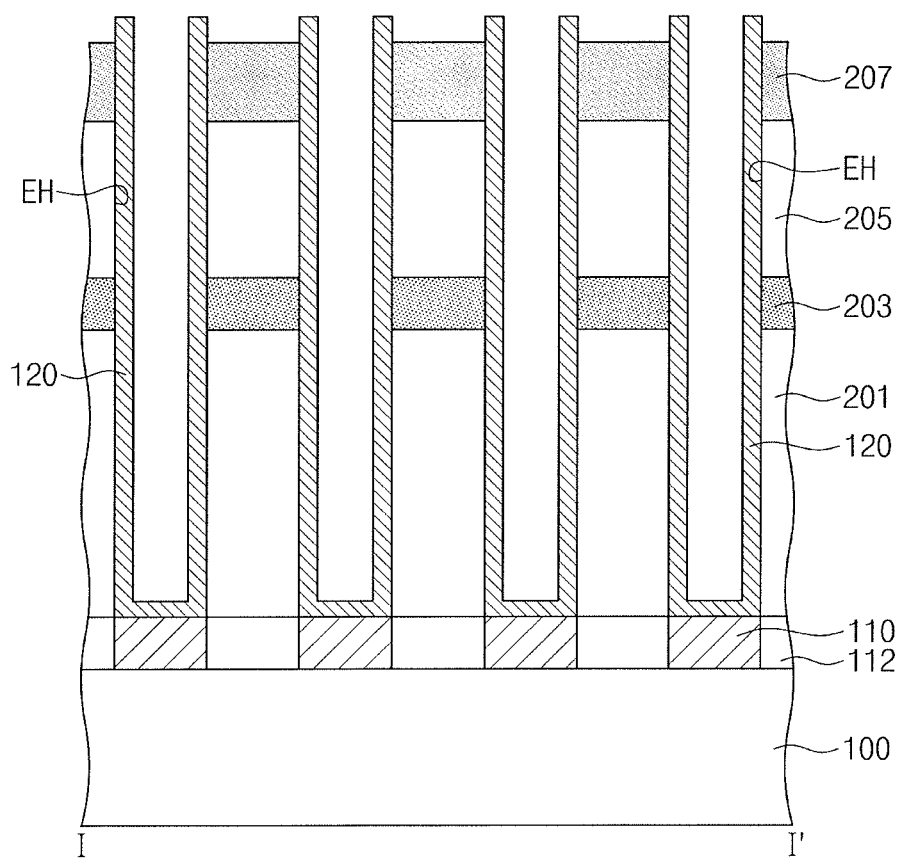

Referring to FIG. 5, the first mask layer 209 may be removed after the anisotropic etching process. Thus, a top surface of the third mold layer 207 may be exposed. The first mask layer 209 may be removed by a dry etching process. For example, the first mask layer 209 may be removed using a fluorine-based gas, e.g., $CF_4$, $CF_4/O_2$, $SF_6$, $C_2F_6/O_2$, or $NF_3$. In another example, the first mask layer 209 may be removed during the anisotropic etching process of forming the electrode holes EH.

The lower electrodes 120 may be formed in the electrode holes EH, respectively. The lower electrodes 120 may be formed to conformally, e.g., and continuously, cover sidewalls and bottom surfaces of the electrode holes EH. Since the electrode holes EH have a high aspect ratio, a deposition process for forming the lower electrodes 120 may use a layer-formation technique having an excellent property of step coverage. For example, the lower electrodes 120 may be formed using a chemical vapor deposition (CVD) process or an atomic layer deposition (ALD) process. For example, each of the lower electrodes 120 may have a U-shape when viewed in a cross-sectional view.

The lower electrodes 120 may include at least one of metal materials, metal nitrides, or a metal silicide. For example, the lower electrodes 120 may be formed of a refractory metal material, e.g., cobalt, titanium, nickel, tungsten, and/or molybdenum. I another example, the lower electrodes 120 may be formed of a metal nitride, e.g., titanium nitride (TiN), titanium-silicon nitride (TiSiN), titanium-aluminum nitride (TiAlN), tantalum nitride (TaN), tantalum-aluminum nitride (TaAlN), and/or tungsten nitride (WN). In yet another example, the lower electrodes 120 may be formed of a noble metal, e.g., platinum (Pt), ruthenium (Ru), and/or iridium (Ir). In still another example, the lower electrodes 120 may be formed of a conductive noble metal oxide (e.g., PtO, $RuO_2$, and/or $IrO_2$) and/or a conductive oxide (e.g., $SrRuO_3$ (SRO), $(Ba,Sr)RuO_3$ (BSRO), $CaRuO_3$ (CRO), and/or LSCo).

An upper portion of the third mold layer 207 may be etched to reduce a thickness of the third mold layer 207. Thus, upper portions of outer sidewalls of the lower electrodes 120 may be exposed by the third mold layer 207, e.g., upper portions of outer sidewalls of the lower electrodes 120 may be extend above an upper surface of the third mold layer 207. The upper portion of the third mold layer 207 may be etched using a wet etching process or a dry etching process. When the wet etching process is used, the third mold layer 207 may be etched using, e.g., hydrofluoric acid (HF). When the dry etching process is used, the third mold layer 207 may be etched using, e.g., an etch-back process.

Figure 6:
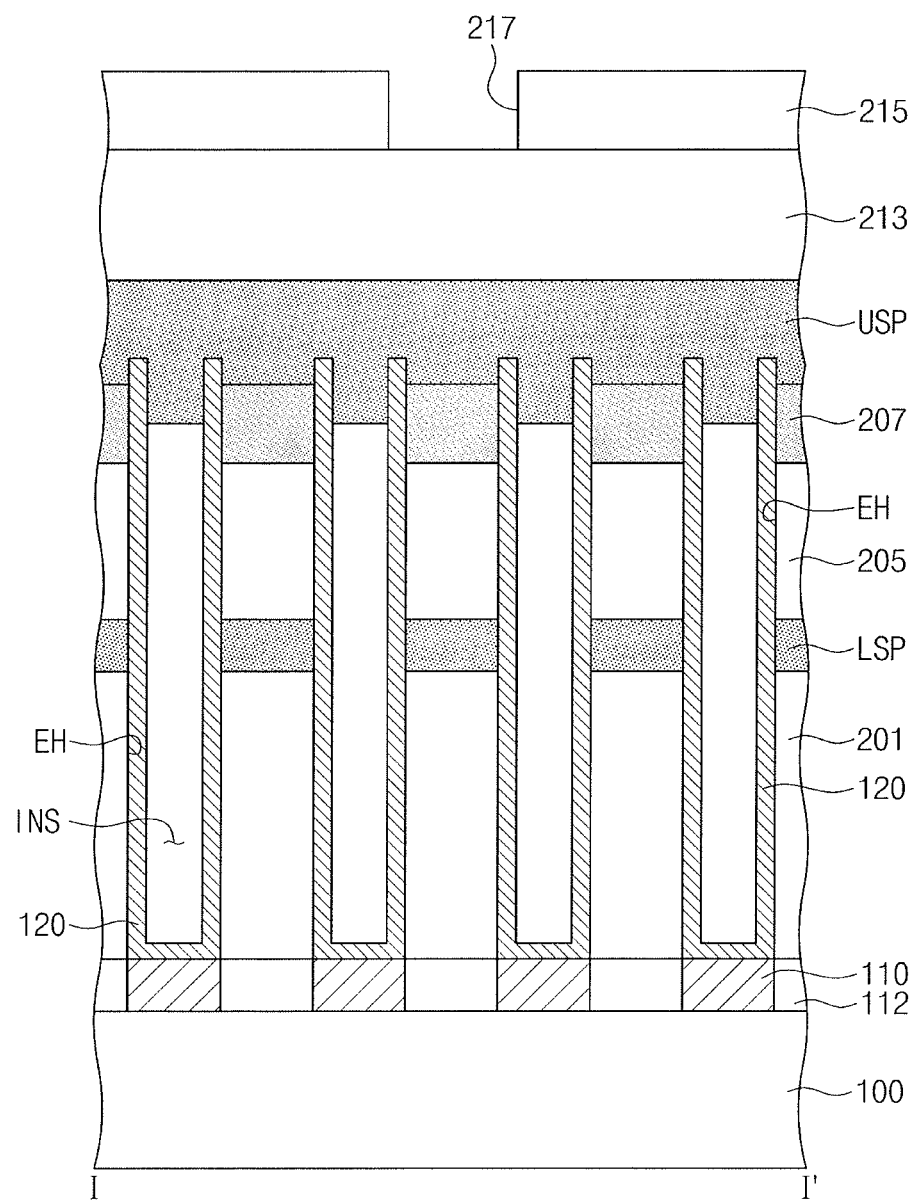

Referring to FIG. 6, the upper support layer USP may be formed on the third mold layer 207. The upper support layer USP may cover the upper portions of the outer sidewalls of the lower electrodes 120 exposed by the third mold layer 207, top surfaces of the lower electrodes 120, and a top surface of the third mold layer 207. The upper support layer USP may be, e.g., partially, disposed in the inner space INS surrounded by each of the lower electrodes 120. For example, the upper support layer USP may fill, e.g., only, upper portions of the inner spaces INS. Thus, the inner spaces INS may be sealed by the upper support layer USP. For example, referring to FIGS. 5-6, due to the height of the topmost surface of the third mold layer 207, an amount of the upper support layer USP deposited in the upper portions of the inner spaces INS may be larger than that on the third mold layer 207, e.g., the upper support layer USP may be deposited to a larger depth in the upper portions of the inner spaces INS (and along inner sidewalls of the lower electrodes 120 surrounding the inner spaces INS) than on the third mold layer 207 (and along outer sidewalls of adjacent lower electrodes 120.

In some embodiments, the upper support layer USP may be formed of a material having a gap-fill characteristic capable of filling the upper portions of the inner spaces INS. In some embodiments, the upper support layer USP may be formed of a material having an etch selectivity with respect to the first mold layer 201, the second mold layer 205, and the third mold layer 207. For example, the upper support layer USP may be formed of at least one of SiOC, SiBN, SiCN, doped SiN, or Si. For example, the upper support layer USP may be formed using a CVD process or an ALD process.

A second mask layer 213 may be formed on the upper support layer USP. The second mask layer 213 may be formed of a material having an etch selectivity with respect to the upper support layer USP. For example, the second mask layer 213 may be formed of an amorphous carbon layer (ACL). A photoresist pattern 215 may be formed on the second mask layer 213. The photoresist pattern 215 may have openings 217. Each of the openings 217 may vertically overlap with a portion of the upper support layer USP, which is surrounded by a pair of the lower electrodes 120 adjacent to each other in the first direction X (see FIG. 1) and a pair of the lower electrodes 120 adjacent to each other in the second direction Y (see FIG. 1) intersecting the first direction X when viewed in a plan view.

Figure 7:
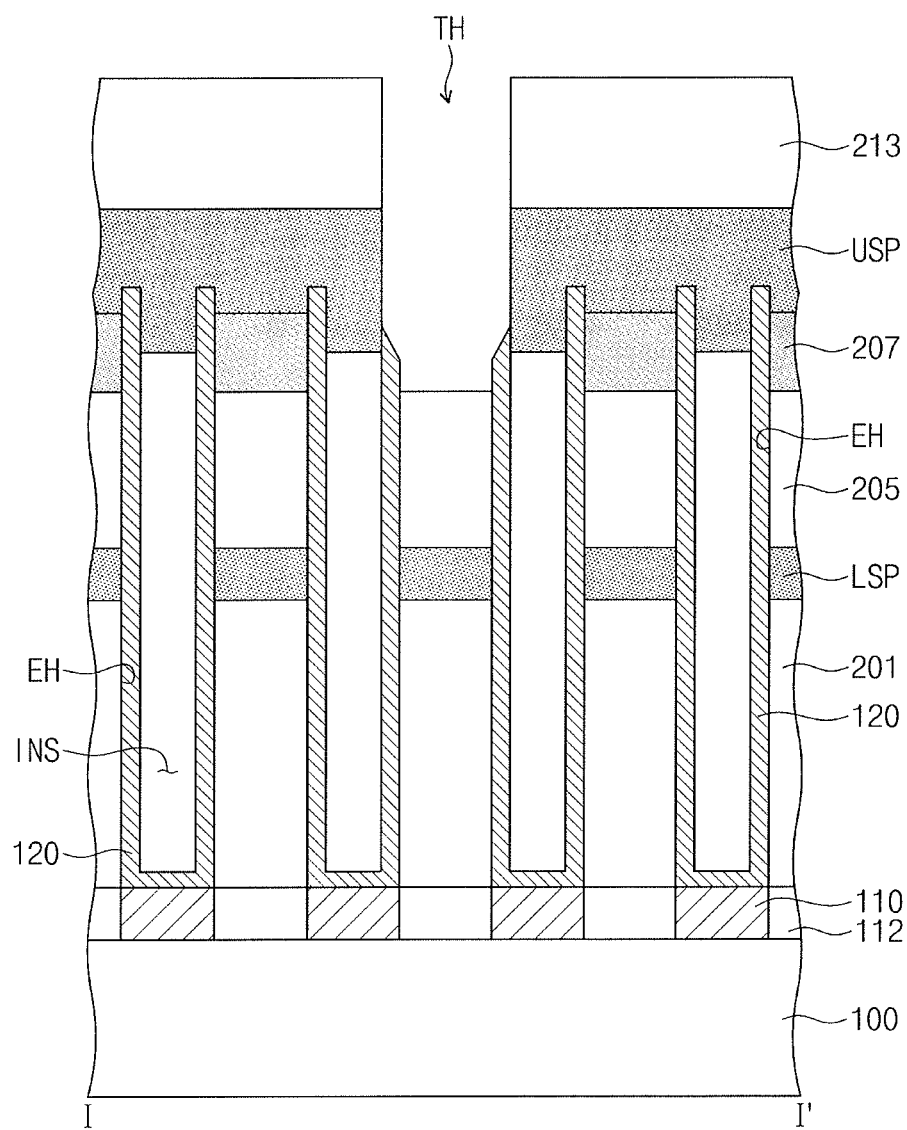

Referring to FIG. 7, the second mask layer 213, the upper support layer USP, and the third mold layer 207 may be sequentially etched using the photoresist pattern 215 as an etch mask. Thus, the through-holes TH may be formed to penetrate the second mask layer 213, the upper support layer USP, and the third mold layer 207. The photoresist pattern 215 may be removed during the etching process of forming the through-holes TH to expose a top surface of the second mask layer 213. For example, the etching process may be a dry etching process. The dry etching process may be performed using, e.g., a $C_xF_y$-based gas or a $CH_xF_y$-based gas.

Portions of the lower electrodes 120, which vertically overlap with the openings 217 (see FIG. 6), may be exposed by the through-holes TH. The through-holes TH may expose portions of a top surface of the second mold layer 205, portions of the third mold layer 207, and portions of the upper support layer USP. Upper portions of the lower electrodes 120 overlapping with the openings 217 (see FIG. 6) may be etched in the etching process of forming the through-holes TH, so top surfaces of the lower electrodes 120 exposed by the through-holes TH may be, e.g., slanted, and located at a lower level than top surfaces of the lower electrodes 120 covered by the upper support layer USP.

Figure 8:
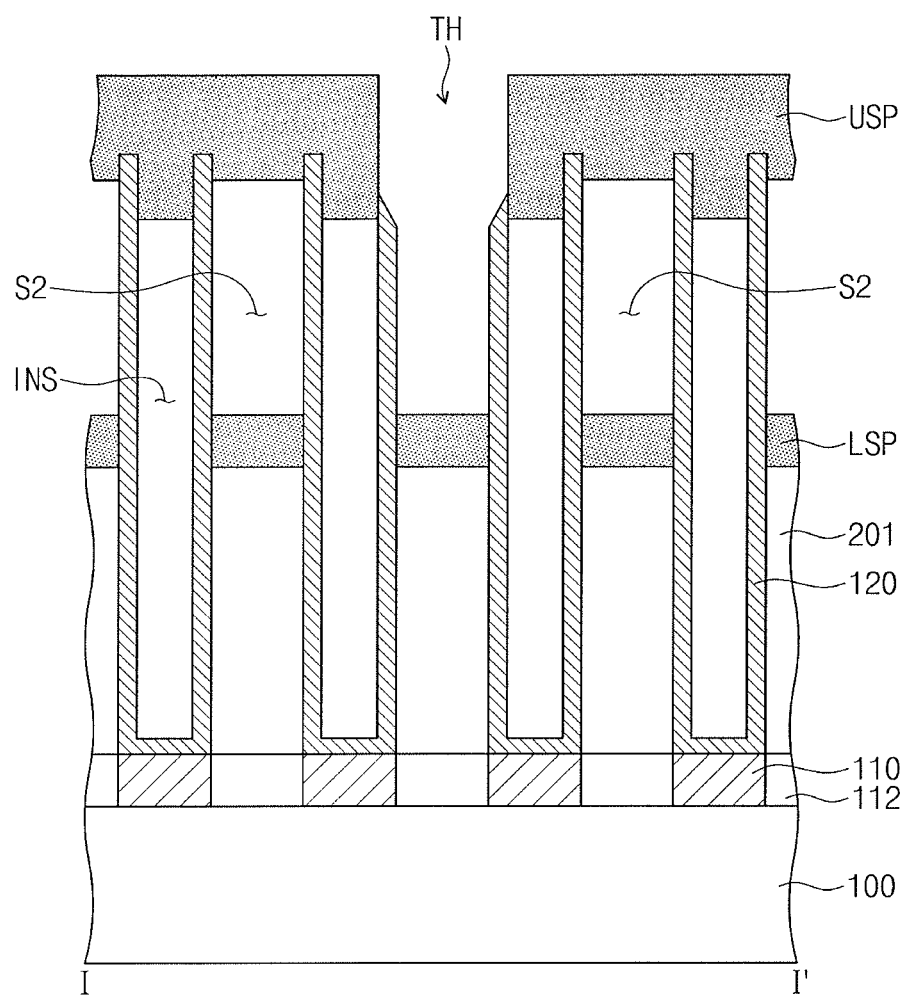

Referring to FIG. 8, the second mask layer 213 may be removed. Thus, a top surface of the upper support layer USP may be exposed. For example, the second mask layer 213 may be removed using an ashing process and a strip process. The third mold layer 207 and the second mold layer 205 exposed by the through-holes TH may be removed. The third mold layer 207 and the second mold layer 205 may be removed to form the second space S2 between the lower support layer LSP and the upper support layer USP. The through-holes TH and the second space S2 may expose the outer sidewalls of the lower electrodes 120 disposed above the lower support layer LSP, a top surface of the lower support layer LSP, and a bottom surface of the upper support layer USP disposed between the lower electrodes 120. The third mold layer 207 and the second mold layer 205 may be removed by a wet etching process using an etching solution having an etch selectivity with respect to the upper support layer USP and the lower support layer LSP. For example, the third mold layer 207 and the second mold layer 205 may be removed using hydrofluoric acid (HF).

Figure 9:
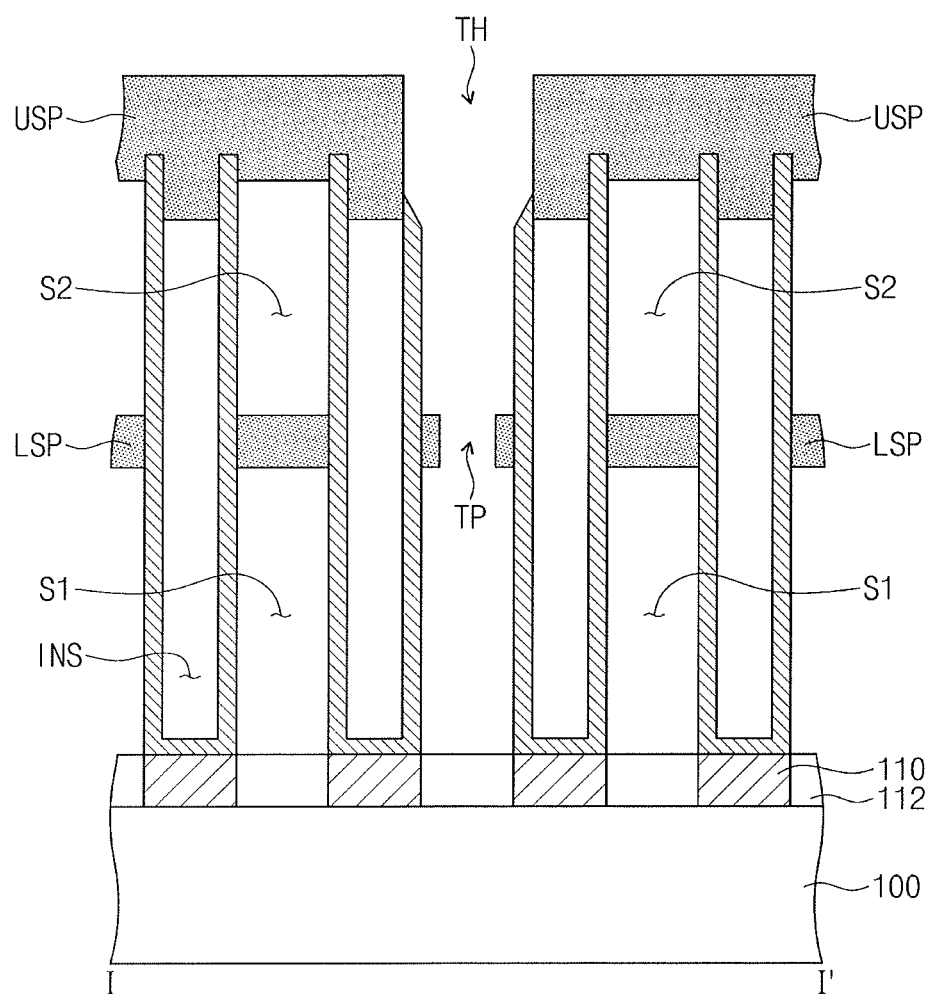

Referring to FIG. 9, portions of the lower support layer LSP exposed by the through-holes TH may be etched. Thus, through-portions TP may be formed in the lower support layer LSP. The through-portions TP may vertically overlap with the through-holes TH. Portions of a top surface of the first mold layer 201 may be exposed by the through-portions TP. Portions of an upper portion of the first mold layer 201 may be removed by over-etching.

The first mold layer 201 exposed by the through-portions TP of the lower support layer LSP may be removed. The first mold layer 201 may be removed to form the first space S1 between the interlayer insulating layer 112 and the lower support layer LSP. The through-holes TH, the through-portions TP, and the first space S1 may expose the outer sidewalls of the lower electrodes 120 disposed below the lower support layer LSP, a top surface of the interlayer insulating layer 112, and a bottom surface of the lower support layer LSP. The first mold layer 201 may be removed by a wet etching process using an etching solution having an etch selectivity with respect to the interlayer insulating layer 112, the upper support layer USP, and the lower support layer LSP. For example, the first mold layer 201 may be removed using hydrofluoric acid (HF).

Referring again to FIG. 2, the dielectric layer 140 may be formed on the substrate 100. For example, the dielectric layer 140 may conformally cover the top surface of the interlayer insulating layer 112, the outer sidewalls of the lower electrodes 120, the top surface, the bottom surface and sidewalls of the lower support layer LSP, and the top surface, the bottom surface and sidewalls of the upper support layer USP. The dielectric layer 140 may be formed by providing a dielectric material through the through-holes TH. The dielectric layer 140 may be formed by a layer-formation technique having an excellent property of step coverage, e.g., a CVD technique or an ALD technique. For example, the dielectric layer 140 may be formed of at least one of a metal oxide (e.g., $HfO_2$, $ZrO_2$, $Al_2O_3$, $La_2O_3$, $Ta_2O_3$, or $TiO_2$) or a perovskite dielectric material (e.g., $SrTiO_3$ (STO), $(Ba,Sr)TiO_3$ (BST), $BaTiO_3$, PZT, or PLZT). The dielectric layer 140 may have a single-layered structure or a multi-layered structure.

The upper electrode 150 may be formed on the dielectric layer 140. The upper electrode 150 may fill the through-holes TH, the first space S1, and the second space S2 and may cover a top surface of the dielectric layer 140. The upper electrode 150 may be formed of at least one of a semiconductor material doped with dopants, a metal material, a metal nitride, or a metal silicide. In some embodiments, the upper electrode 150 may be formed of a refractory metal material, e.g., cobalt, titanium, nickel, tungsten, and/or molybdenum. In certain embodiments, the upper electrode 150 may be formed of a metal nitride, e.g., titanium nitride (TiN), titanium-aluminum nitride (TiAlN), and/or tungsten nitride (WN). In certain embodiments, the upper electrode 150 may be formed of at least one of, e.g., platinum (Pt), ruthenium (Ru), or iridium (Ir).

FIGS. 10 to 15 are cross-sectional views taken along line I-I' of FIG. 1 to illustrate a method of manufacturing a semiconductor memory device according to some embodiments. Hereinafter, the same elements as described in the above embodiments will be indicated by the same reference numerals or the same reference designators. In addition, the descriptions to the same elements as in the above embodiments will be omitted or mentioned only briefly for the purpose of ease and convenience in explanation.

Figure 10:
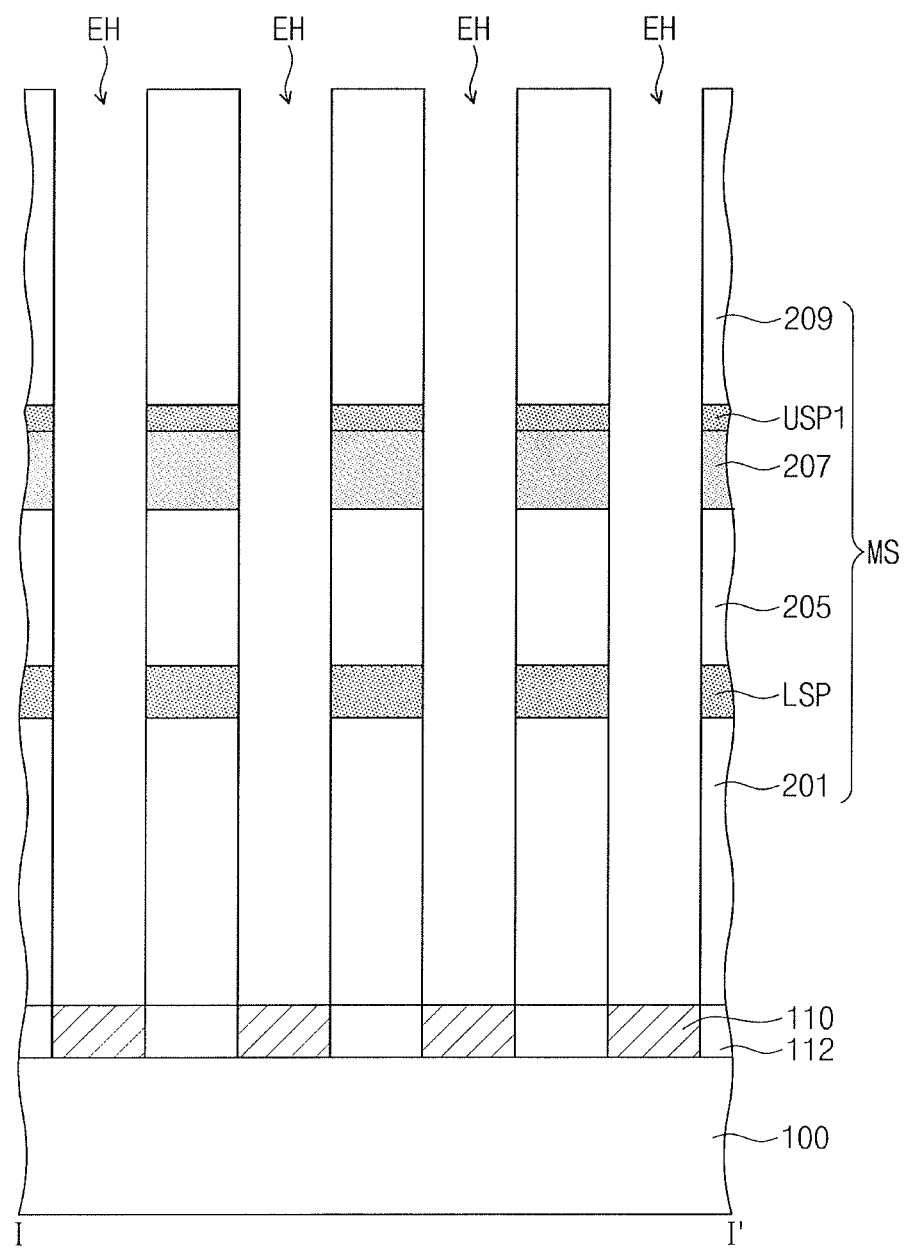
FIGS. 10 to 15 illustrate cross-sectional views corresponding to line I-I' of FIG. 1 of stages in a method of manufacturing a semiconductor memory device according to some embodiments.

Referring to FIG. 10, the mold structure MS may be formed on the interlayer insulating layer 112. The mold structure MS may include the first mold layer 201, the lower support layer LSP, the second mold layer 205, the third mold layer 207, the first upper support layer USP1, and the first mask layer 209, which are sequentially stacked on the interlayer insulating layer 112. The first upper support layer USP1 may include a material having an etch selectivity with respect to the third mold layer 207 and the second mold layer 205. For example, the first upper support layer USP1 may be formed of at least one of SiOC, SiBN, SiCN, doped SiN, or Si.

The electrode holes EH may be formed in the mold structure MS. In some embodiments, the first mask layer 209, the first upper support layer USP1, the third mold layer 207, the second mold layer 205, the lower support layer LSP, and the first mold layer 201 may be anisotropically etched using a mask pattern formed on the mold structure MS as an etch mask to form the electrode holes EH. The top surfaces of the contact plugs 110 may be exposed by the electrode holes EH. The first mask layer 209 may be removed after the formation of the electrode holes EH. Thus, a top surface of the first upper support layer USP1 may be exposed.

Figure 11:
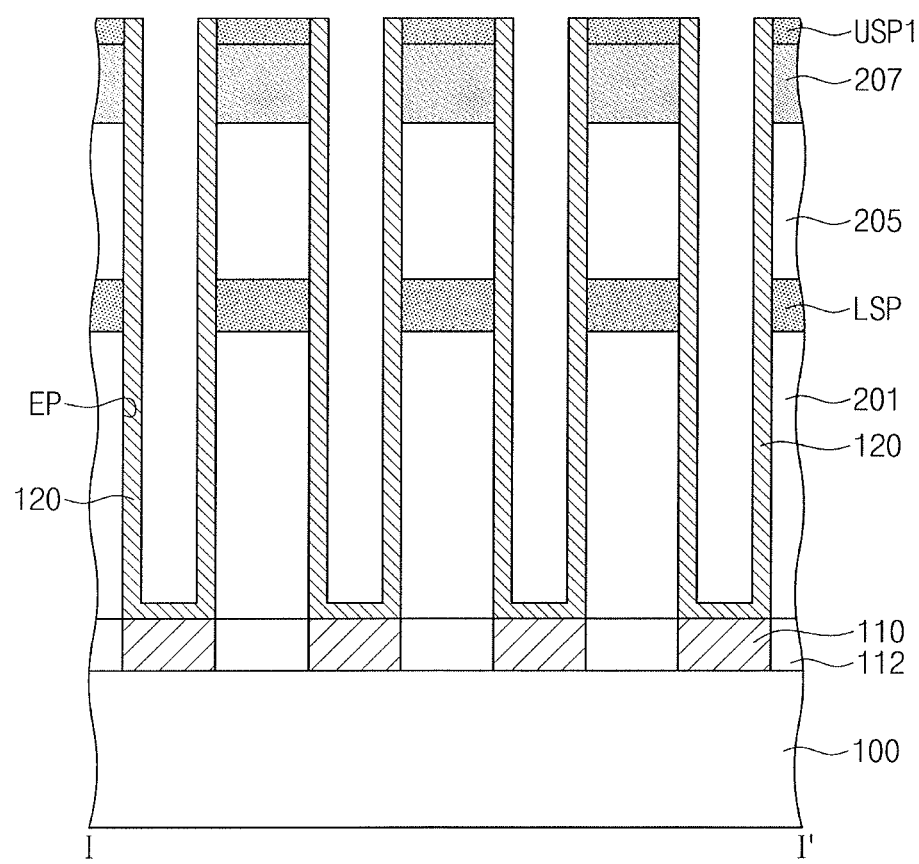

Referring to FIG. 11, the lower electrodes 120 may be formed in the electrode holes EH, respectively. The lower electrodes 120 may be formed to conformally cover sidewalls and bottom surfaces of the electrode holes EH.

Figure 12:
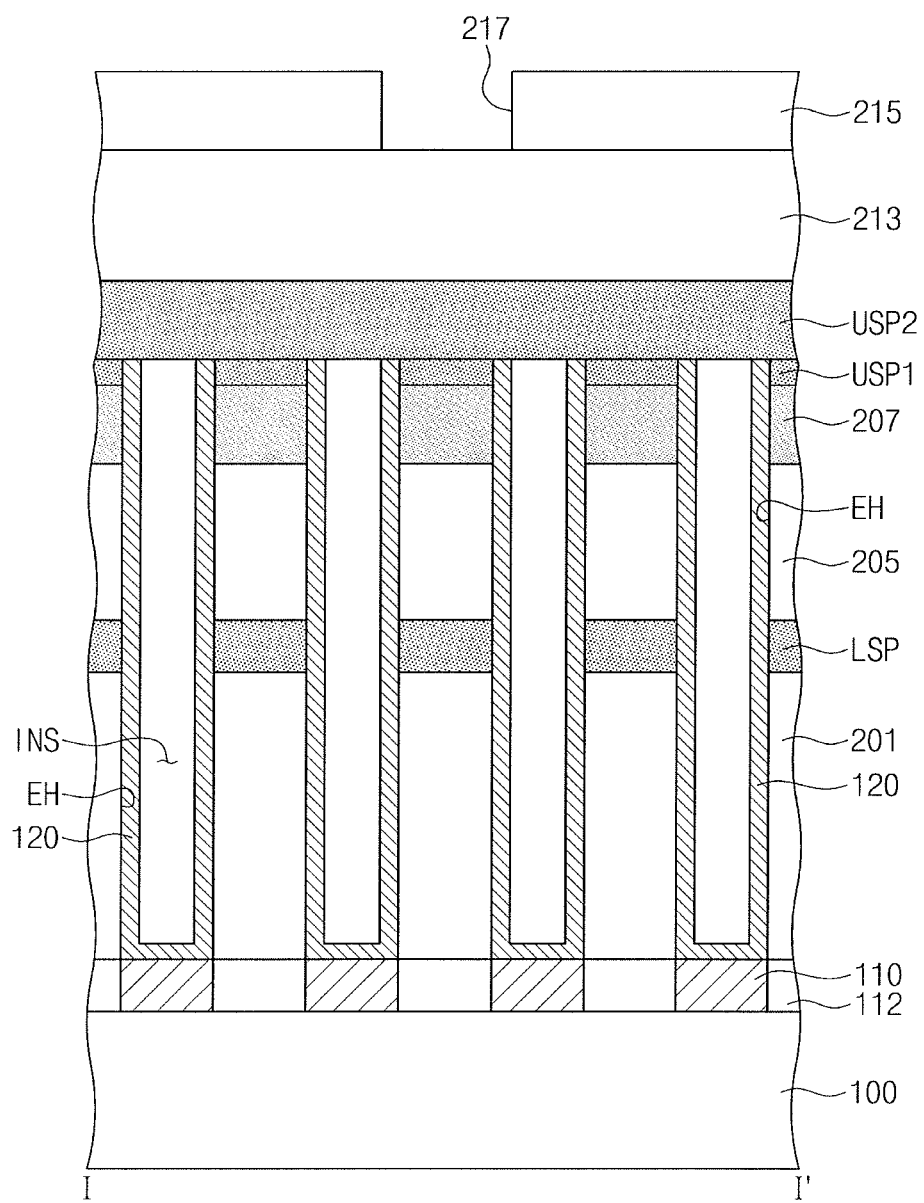

Referring to FIG. 12, the second upper support layer USP2 may be formed on top surfaces of the lower electrodes 120 and the top surface of the first upper support layer USP1. The second upper support layer USP2 may not be disposed in the inner spaces INS of the lower electrodes 120. The inner spaces INS may be sealed by the second upper support layer USP2. The second upper support layer USP2 may be formed of a material having an etch selectivity with respect to the first mold layer 201, the second mold layer 205, and the third mold layer 207. For an example, the second upper support layer USP2 may be formed of the same material as the first upper support layer USP1. For another example, the second upper support layer USP2 may be formed of a different material from that of the first upper support layer USP1. For example, the second upper support layer USP2 may be formed of at least one of SiOC, SiBN, SiCN, doped SiN, or Si. For example, the second upper support layer USP2 may be formed using a CVD process or a physical vapor deposition (PVD) process. The second mask layer 213 and the photoresist pattern 215 may be sequentially formed on the second upper support layer USP2.

Figure 13:
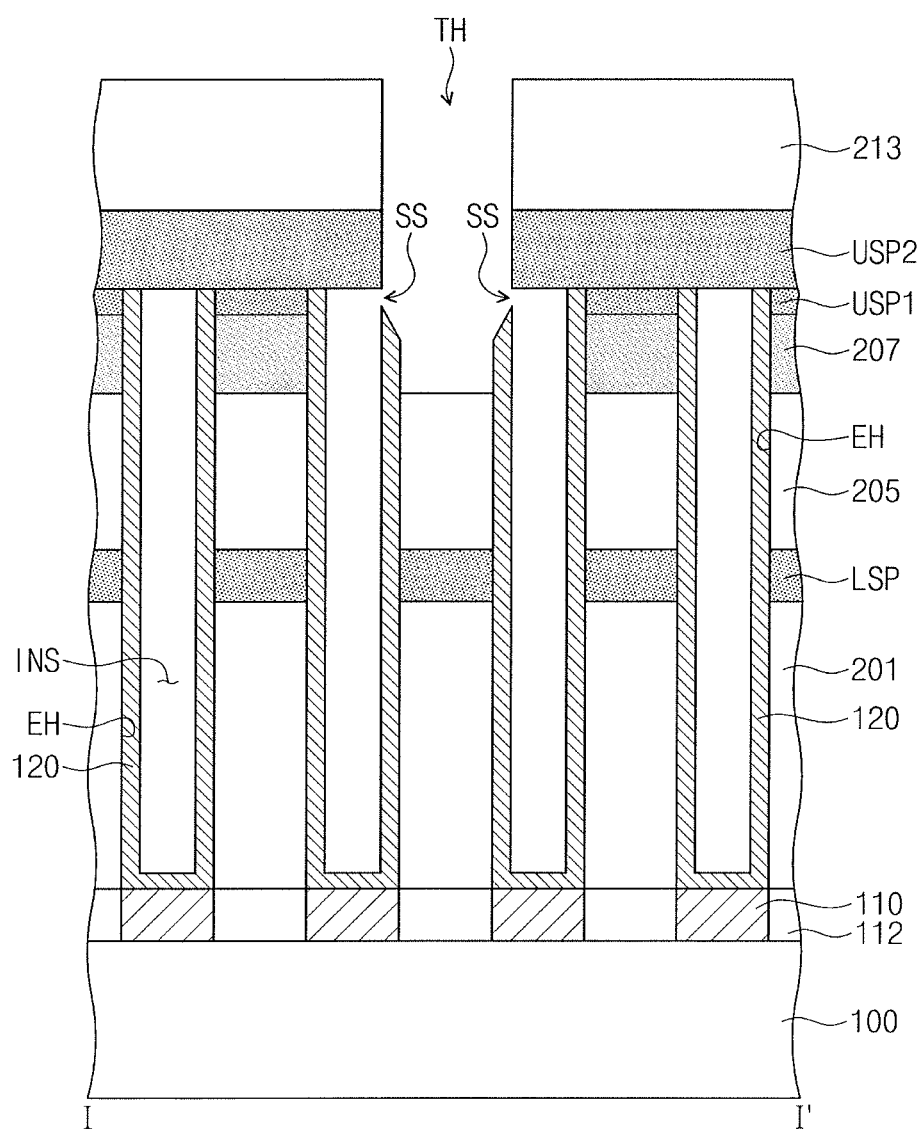

Referring to FIG. 13, the second mask layer 213, the second upper support layer USP2, the first upper support layer USP1, and the third mold layer 207 may be sequentially etched using the photoresist pattern 215 as an etch mask. Thus, the through-holes TH may be formed to penetrate the second mask layer 213, the second upper support layer USP2, the first upper support layer USP1, and the third mold layer 207. For example, the etching process may be a dry etching process. The dry etching process may be performed using, e.g., a $C_xF_y$-based gas or a $CH_xF_y$-based gas. The through-holes TH may expose portions of the lower electrodes 120, which vertically overlap with the openings 217 (see FIG. 12) of the photoresist pattern 215. The through-holes TH may also expose portions of the second upper support layer USP2, portions of the first upper support layer USP1, portions of the third mold layer 207, and portions of the top surface of the second mold layer 205.

The portions of the lower electrodes 120 which overlap with the openings 217 (see FIG. 12) may be etched in the etching process of forming the through-holes TH. Thus, top surfaces of the portions of the lower electrodes 120 which overlap with the through-holes TH may be located at a lower level than top surfaces of portions of the lower electrodes 120 covered by the second upper support layer USP2. In some embodiments, the portions of the lower electrodes 120 which overlap with the through-holes TH may be spaced apart from the second upper support layer USP2. Thus, the separation spaces SS may be formed between the second upper support layer USP2 and the portions of the lower electrodes 120 which overlap with the through-holes TH. The inner spaces INS may be connected to the through-holes TH through the separation spaces SS.

Figure 14:
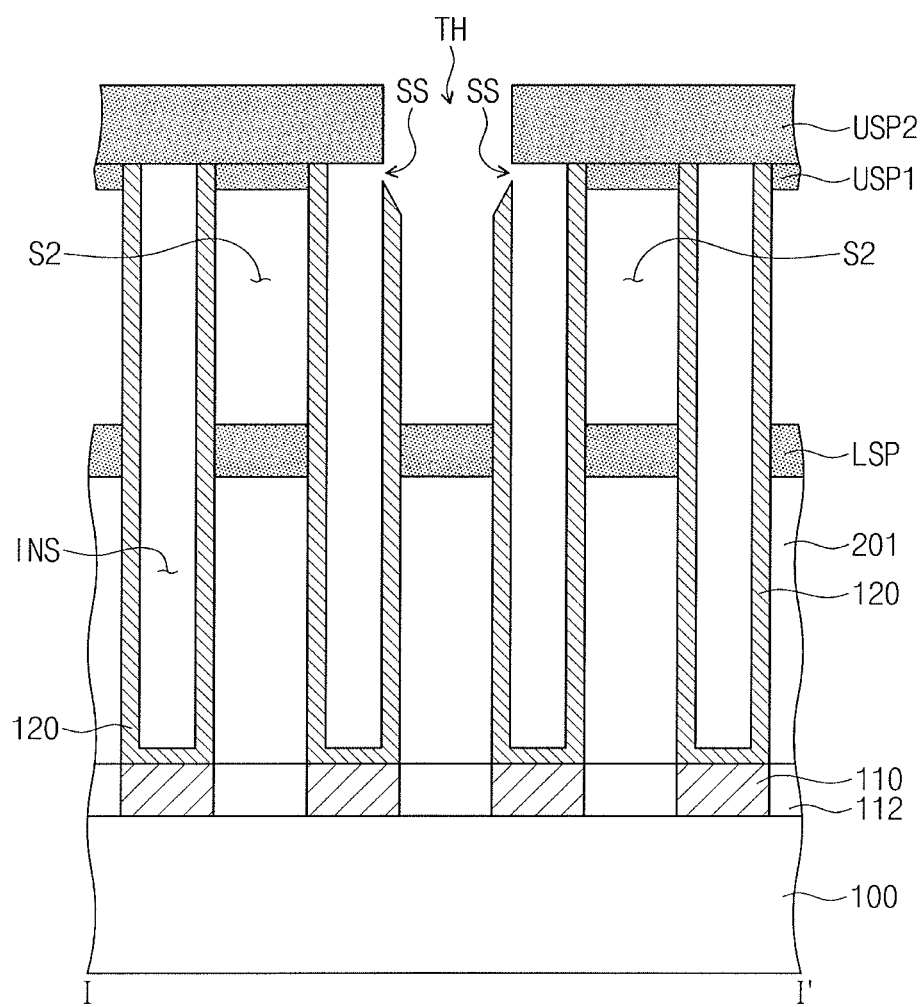

Referring to FIG. 14, the second mask layer 213 may be removed. Thus, a top surface of the second upper support layer USP2 may be exposed. The third mold layer 207 and the second mold layer 205 exposed by the through-holes TH may be removed. Since the first and second upper support layers USP1 and USP2 include material having an etch selectivity with respect to the second and third mold layers 205 and 207, the first and second upper support layers USP1 and USP2 may not be removed when the second and third mold layers 205 and 207 are removed.

The third mold layer 207 and the second mold layer 205 may be removed to form the second space S2 between the lower support layer LSP and the first upper support layer USP1. The through-holes TH and the second space S2 may expose the outer sidewalls of the lower electrodes 120 disposed above the lower support layer LSP, the top surface of the lower support layer LSP, and a bottom surface of the first upper support layer USP1.

Figure 15:
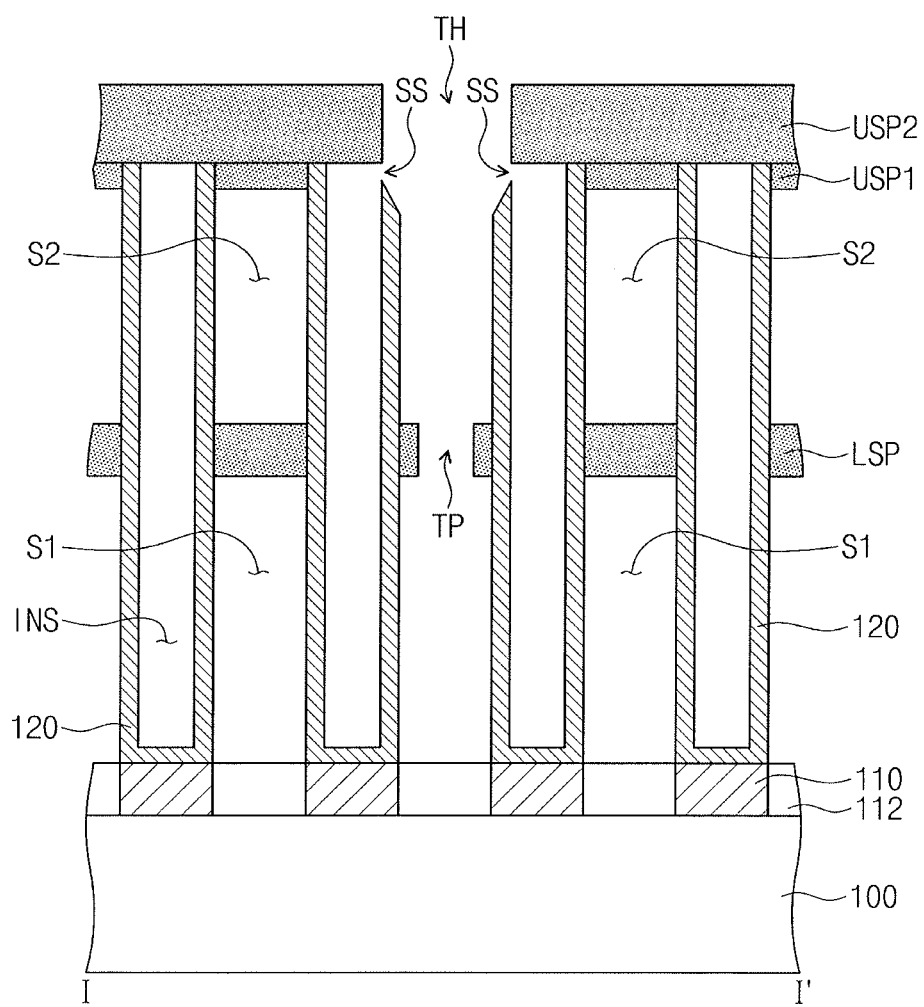

Referring to FIG. 15, portions of the lower support layer LSP exposed by the through-holes TH may be etched. Thus, through-portions TP may be formed in the lower support layer LSP. Portions of a top surface of the first mold layer 201 may be exposed by the through-portions TP. The first mold layer 201 exposed by the through-portions TP of the lower support layer LSP may be removed. The first mold layer 201 may be removed to form the first space S1 between the interlayer insulating layer 112 and the lower support layer LSP. The through-holes TH, the through-portions TP, and the first space S1 may expose the outer sidewalls of the lower electrodes 120 disposed below the lower support layer LSP, a top surface of the interlayer insulating layer 112, and a bottom surface of the lower support layer LSP.

Referring again to FIG. 3, the dielectric layer 140 may be formed on the substrate 100. For example, the dielectric layer 140 may conformally cover the top surface of the interlayer insulating layer 112, the outer sidewalls of the lower electrodes 120, the top surface, the bottom surface and sidewalls of the lower support layer LSP, the bottom surface of the first upper support layer USP1, and the top surface and sidewalls of the second upper support layer USP2. The dielectric layer 140 may fill the separation spaces SS between the second upper support layer USP2 and the portions of the lower electrodes 120 which overlap with the through-holes TH. An upper electrode 150 may be formed on the dielectric layer 140. The upper electrode 150 may fill the through-holes TH, the first space S1, and the second space S2 and may cover a top surface of the dielectric layer 140.

By way of summation and review, embodiments provide a semiconductor memory device with improved electrical characteristics. That is, according to embodiments, a portion of a lower capacitor electrode in contact with a supporter on an outer sidewall of the lower capacitor electrode, which is not used as a portion of the capacitor, may be reduced in size to increase capacitance of the capacitor.

In detail, as the upper support layer supporting the lower electrode of the capacitor may be disposed on the top surface of the lower electrode, the usable area of the lower electrode may be increased. As a result, the capacitance of the capacitor may be increased.

Further, as the upper support layer supporting the lower electrode of the capacitor may be disposed on the top surface of the lower electrode, the contact area between the lower electrode and the upper support layer may be reduced, e.g., as the contact exists only in upper portions above inner spaces. As a result, stress applied to the upper support layer between adjacent lower electrodes may be minimized to reduce a difference between a first distance (i.e., between the lower electrodes between which the upper support layer is provided) and a second distance (i.e., between the lower electrodes between which the upper support layer is not provided).

Furthermore, as the upper support layer supporting the lower electrode of the capacitor may still be disposed in the inner space surrounded by the lower electrode, e.g., even though only in upper portions thereof, the contact area between the upper support layer and the lower electrode may be sufficient for reliable support. Therefore, the supporting force of the upper support layer may be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising: lower electrodes, each lower electrode of the lower electrodes surrounding an inner space; an upper support layer on top surfaces of the lower electrodes, the upper support layer being in the inner spaces surrounded by the lower electrodes; and an upper electrode on the upper support layer, the upper electrode filling first and second regions, the second region penetrating the upper support layer, and the first region extending from the second region into between the lower electrodes, wherein each of the lower electrodes includes: a first portion overlapping with the first region, the first portion being vertical and including an inclined top surface, an entirety of the inclined top surface of the first portion being exposed by the upper support layer, and a second portion covered by the upper support layer, the second portion having a vertical part and a horizontal part, the horizontal part electrically connects a bottom of the first portion and a bottom of the vertical part of the second portion, and a top surface of the vertical part of the second portion being in contact with the upper support layer.

2. The semiconductor memory device as claimed in claim 1, wherein the top surface of the first portion is at a lower level than the top surface of the second portion.

3. The semiconductor memory device as claimed in claim 1, wherein the upper support layer is on an upper portion of an outer sidewall of the second portion.

4. The semiconductor memory device as claimed in claim 3, wherein a bottom surface of the upper support layer in the inner space is at a lower level than a bottom surface of the upper support layer on the upper portion of the outer sidewall of the second portion.

5. The semiconductor memory device as claimed in claim 1, further comprising a lower support layer on outer sidewalls of the lower electrodes, the lower support layer being under the upper support layer.

6. The semiconductor memory device as claimed in claim 5, wherein the upper electrode penetrates a portion of the lower support layer on an outer sidewall of the first portion, and the upper electrode does not penetrate a portion of the lower support layer on an outer sidewall of the second portion.

7. The semiconductor memory device as claimed in claim 1, wherein the upper support layer is in contact with inner sidewalls of the lower electrodes and is spaced apart from bottom surfaces of the lower electrodes.

8. The semiconductor memory device as claimed in claim 1, wherein the upper support layer includes at least one of SiOC, SiBN, SiCN, doped SiN, or Si.

9. The semiconductor memory device as claimed in claim 1, wherein sidewalls of the second portion are in contact with the upper support layer.

10. The semiconductor memory device as claimed in claim 9, wherein a contact area between the upper support layer and an inner sidewall of the second portion is greater than a contact area between the upper support layer and an outer sidewall of the second portion.

11. The semiconductor memory device as claimed in claim 1, wherein each of the lower electrodes has a U-shape when viewed in a cross-sectional view, and the inner space is in a center of the U-shape.

12. The semiconductor memory device as claimed in claim 1, further comprising a dielectric layer between the upper electrode and the lower electrodes, and between the upper electrode and the upper support layer,
   wherein the dielectric layer is in contact with the top surface of the first portion, and
   wherein the dielectric layer is spaced apart from the top surface of the second portion.

13. The semiconductor memory device as claimed in claim 1, wherein the inner space between a bottom surface of each of the lower electrodes and a bottom surface of the upper support layer in the inner space is filled with air.

14. The semiconductor memory device as claimed in claim 1, wherein the second portion does not vertically overlap with the first region.

15. A semiconductor memory device, comprising: lower electrodes, each lower electrode of the lower electrodes surrounding an inner space; an upper support layer on top surfaces of the lower electrodes, the upper support layer being in the inner spaces surrounded by the lower electrodes; and an upper electrode on the upper support layer, the upper electrode filling first and second regions, the second region penetrating the upper support layer, and the first region extending from the second region into between the lower electrodes, wherein each of the lower electrodes includes: a first portion overlapping with the first region, an entirety of a top surface of the first portion not overlapping with the upper support layer in a vertical direction, and a second portion covered by the upper support layer, the second portion having a vertical part and a horizontal part, the horizontal part electrically connects a bottom of the first portion and a bottom of the vertical part of the second portion, and a top surface of the vertical part of the second portion vertically overlapping with the upper support layer.

16. The semiconductor memory device as claimed in claim 15, wherein a top surface of the first portion is at a lower level than a top surface of the second portion, the top surfaces of the first and second portions of a same lower electrode being spaced apart from each other along a horizontal direction, and a portion of the upper support layer extending into a space between the top surfaces of the first and second portions of the same lower electrode.

17. The semiconductor memory device as claimed in claim 15, wherein the upper support layer is on an upper portion of an outer sidewall of the second portion, a portion of the upper support layer extending between facing sidewalls of the first and second portions of a same lower electrode.

18. The semiconductor memory device as claimed in claim 17, wherein a bottom surface of the upper support layer in the inner space is at a lower level than a bottom surface of the upper support layer on the outer sidewall of the second portion.

19. The semiconductor memory device as claimed in claim 15, wherein the upper support layer is in contact with inner sidewalls of the lower electrodes and is spaced apart from bottom surfaces of the lower electrodes.

20. A semiconductor memory device, comprising:
lower electrodes, each lower electrode of the lower electrodes surrounding an inner space;
an upper support layer on top surfaces of the lower electrodes, the upper support layer being inside each one of the inner spaces surrounded by the lower electrodes; and
an upper electrode on the upper support layer, the upper electrode filling first and second regions, the second region penetrating the upper support layer, and the first region extending from the second region into between the lower electrodes,
wherein each of the lower electrodes includes:
a first portion overlapping with the first region, an outer sidewall of the first portion being spaced apart from the upper support layer, and
a second portion covered by the upper support layer, an outer sidewall of the second portion being in contact with the upper support layer,
wherein sidewalls of the second portion are in contact with the upper support layer, and
wherein a contact area between the upper support layer and an inner sidewall of the second portion is greater than a contact area between the upper support layer and the outer sidewall of the second portion.

* * * * *